(12) United States Patent
Duby et al.

(10) Patent No.: US 8,217,702 B2
(45) Date of Patent: Jul. 10, 2012

(54) CIRCUITRY FOR PROCESSING SIGNALS FROM A HIGHER VOLTAGE DOMAIN USING DEVICES DESIGNED TO OPERATE IN A LOWER VOLTAGE DOMAIN

(75) Inventors: Jean-Claude Duby, Saint Egreve (FR); Flora Leymarie, Claix (FR); Thierry Padilla, Claix (FR)

(73) Assignee: ARM Limited, Cambridge (GB)

( * ) Notice: Subject to any disclaimer, the term of this patent is extended or adjusted under 35 U.S.C. 154(b) by 274 days.

(21) Appl. No.: 12/662,197

(22) Filed: Apr. 5, 2010

(65) Prior Publication Data

US 2010/0264976 A1    Oct. 21, 2010

(30) Foreign Application Priority Data

Apr. 20, 2009  (GB) .................................. 0906777.8

(51) Int. Cl.
*H03L 5/00* (2006.01)
(52) U.S. Cl. ........................................................ 327/333
(58) Field of Classification Search .................. None
See application file for complete search history.

(56) References Cited

U.S. PATENT DOCUMENTS

| | | | |
|---|---|---|---|
| 6,133,756 A * | 10/2000 | Kitao | 326/83 |
| 7,061,298 B2 | 6/2006 | Mentze et al. | |
| 7,078,953 B2 | 7/2006 | Kondou et al. | |
| 7,239,178 B1 * | 7/2007 | Cornell et al. | 326/81 |
| 2002/0149401 A1 * | 10/2002 | Hall et al. | 327/108 |
| 2007/0063758 A1 * | 3/2007 | Allard et al. | 327/333 |
| 2008/0061832 A1 * | 3/2008 | Hu et al. | 326/83 |
| 2010/0264974 A1 * | 10/2010 | Rien et al. | 327/313 |
| 2010/0271736 A1 * | 10/2010 | Rien et al. | 361/18 |

FOREIGN PATENT DOCUMENTS

WO    WO 99/43086    8/1999
WO    WO 00/01070    1/2000

OTHER PUBLICATIONS

UK Search Report dated Aug. 13, 2009 for GB 0906777.8.

* cited by examiner

*Primary Examiner* — Lincoln Donovan
*Assistant Examiner* — Khareem E Almo
(74) *Attorney, Agent, or Firm* — Nixon & Vanderhye P.C.

(57) ABSTRACT

An apparatus is disclosed for receiving input signals in a first higher voltage domain and for generating and outputting signals in a second lower voltage domain, said apparatus comprising: an input pad; output circuitry, said output circuitry being configured to switch to output a first predetermined value in response to a rising input signal exceeding an upper threshold value and to switch to output a second predetermined value in response to a falling input signal falling below a lower threshold value; a first input path; a second input path; and a controllable connecting path between said first and second inputs.

20 Claims, 7 Drawing Sheets

CIRCUITRY FOR PROCESSING SIGNALS FROM A HIGHER VOLTAGE DOMAIN USING DEVICES DESIGNED TO OPERATE IN A LOWER VOLTAGE DOMAIN

BACKGROUND OF THE INVENTION

1. Field of the Invention

The field of the invention relates to circuitry processing signals from a higher voltage domain using devices configured to operate in a lower voltage domain.

2. Description of the Prior Art

Advances in the field of electronics have led to a reduction in both core and input-output power supplies in order to increase processing speeds and reduce power consumption. The transistor dimensions and oxide thickness have also decreased for the same speed reasons.

Thus, for devices of 45 nm, the "standard" external power is now 1.8V where it was previously 3.3V or 2.5V. In order to be able to reach high frequencies the oxide thickness has been decreased and is now around 28 to 32 Å for 1.8V devices (where previously it was about 50 Å).

There are therefore now some apparatus that operate with the new devices in circuits that receive or generate signals in the old higher voltage domains. For example, to be compatible with some older chips and a few standard protocols some input-output cells must receive signals from the older chips at the nominal 3.3V and output signals at the nominal 1.8V for circuitry operating at these levels, while using the new devices that operate at the nominal 1.8V.

In order to ensure that these devices are not overstressed with the accompanying problems of oxide breakdown and lifetime degradation due to HCI (hot carrier injection) precautions need to be taken.

Embodiments of the present invention seek to provide a receiver capable of receiving signals from a higher voltage domain and outputting these signals in the new lower voltage domain, using modern devices designed for the new lower voltage domain.

SUMMARY OF THE INVENTION

Viewed from a first aspect the present invention provides an apparatus for receiving input signals in a first higher voltage domain and for generating and outputting signals in a second lower voltage domain, said apparatus comprising: an input pad for receiving said input signals in said first higher voltage domain; output circuitry comprising a plurality of devices arranged between a high voltage source of said second lower voltage domain and a low voltage source, said plurality of devices being arranged in a first set and a second set, said first set being arranged between said high voltage source and said output and said second set being arranged between said output and said low voltage source, said output circuitry being configured to switch to output a first predetermined value in response to a rising input signal exceeding an upper threshold value and to switch to output a second predetermined value in response to a falling input signal falling below a lower threshold value; a first input path for sending said received input signals to a first input of said first set; a second input path for sending said received input signals to a second input of said second set; wherein said second input path comprises a switch delay device for reducing a voltage of said received input signal such that on a rising input signal, said input signal has reached a higher value when said output circuitry switches in response to said input signal than it would have reached had said input signal voltage not been reduced; and a controllable connecting path between said first and second inputs for connecting said first and second inputs together in response to detection of said first predetermined value at said output and for not connecting said first and second inputs together in response to detection of said second predetermined value at said output.

The present invention recognises that when providing an apparatus that can receive input signals in a first higher voltage domain and output them in a second lower voltage domain using devices designed to operate in the second lower voltage domain there can be problems with these devices becoming stressed. It addresses this by using the second lower voltage domain as the power supply for this apparatus and thus, an apparatus that operates in the lower voltage domain but can receive signals in the higher domain is provided. However, although this addresses the problem of the devices becoming overstressed, it raises its own problems with the threshold voltages that cause the apparatus to switch being low as they need to be within the low voltage domain.

As the apparatus is operating in the second lower voltage domain it is difficult to provide threshold levels that can be met at all times for the device to switch consistently particularly if hysteresis is added. A digital device that switches state in response to a signal, switches when the signal exceeds a high threshold voltage VIH and switches back in response to the signal falling below a low threshold value VIL. With standard devices without hysteresis, the VIH and VIL are equal. But hysteresis is desirable in most of the cases as it provides some noise immunity. Thus, many designs insert hysteresis into the apparatus. Adding hysteresis typically adds about 330 mV (10% of the power supply) difference between the threshold values. In the present case where higher value signals are received that need to be limited to the values of the lower voltage domain it can be difficult to set the threshold levels to appropriate values within this power domain that enable the devices to switch consistently with hysteresis.

For example, if the high power domain is 3.3V and the low power domain 1.8V then the VIH is conventionally 2V and the VIL is 0.8V. This means that the receiver must always switch between 0.8V and 2V. Generally, therefore a typical threshold of 1.4V is used to keep the symmetry and have a well balanced switching device. In a switching device operating in the 1.8V domain such as that of embodiments of the present invention then having the 1.4V as typical threshold is not possible without completely unbalancing the device, because it's too close to the power supply. It does not allow any space to add the 330 mV nominal hysteresis value and still be within safe limits. In other words the problem to be addressed was can the input threshold on the rising edge VIH could be increased to generate hysteresis, while using a low power supply, without unbalancing the switching device and having negative impact on the transient behaviour of the receiver.

The current invention addresses this by providing two input paths for the input signal and reducing a the voltage of the received input signal on a rising edge on the lower voltage path. This means that when this signal reaches a sufficient value for the output circuitry to switch the input signal on the higher voltage path has reached a higher value than it would have done had this voltage level not been reduced. This means that the output circuitry switches at a higher level. Furthermore, by providing a switchable connecting path that connects the higher voltage and lower voltage path on a falling edge, there is no reduction in voltage on either path for the falling edge and the device switches as usual.

Thus, an asymmetry has been added to the device by increasing the input threshold on the rising edge thereby generating hysteresis.

In some embodiments, the apparatus comprises a voltage control circuit for controlling a maximum voltage of an input signal such that said value does not exceed a high voltage level of said second power domain.

Although the apparatus has been powered in the second low power voltage domain so that the devices used are not stressed by the higher voltage domain the input signal is received at this higher voltage domain and therefore to protect the devices, a voltage control circuit is used at the input to clamp the maximum voltage of this input signal to the higher voltage level of the second power domain.

In some embodiments, said voltage control circuit comprises a first and a second pass gate powered in said second lower voltage domain on each of said first and second input paths for limiting said input signal to voltage levels in said second lower voltage domain, said pass gate in said second input path being downstream of said switch delay device.

One way of implementing this voltage control can be to use pass gates that are powered in the second lower voltage domain on each of the input paths. It will be clear that an alternative could be to use a single gate at the input before the paths split.

In some embodiments, said apparatus further comprises a capacitive device arranged on said second input path in parallel with said switch delay device.

The switch delay device on the second input path reduces the voltage on the input signal delaying its switching and providing the required hysteresis.

When the device is operating in transient mode the delay device on the second input path will slow down a little bit the propagation of the transient signal. To balance this negative effect, a capacitive device is used in parallel with this delay device. This capacitive device will react to the fast changing signals and will speed up the transition around the delay device in transient operation when a high frequency signal is sent and is not operational and thus, does not affect the circuit in non-transient or DC mode.

In some embodiments said apparatus further comprises a second capacitive device arranged in parallel with said pass gate on said second input path.

It is often important in these circuits that they are well balanced and it has been found that providing a capacitive device in parallel with the switch delay device and not doing so with the pass gate on the second input path will imbalance the device. Thus, it has been found to be advantageous to place a capacitive device in parallel with the pass gate on this input path as well as this provides a device that is well balanced and therefore functions correctly.

In some embodiments, said switch delay device comprises a diode device for preventing a rising input signal from being transmitted until said rising input signal has reached a turn on voltage sufficient to turn said diode device on.

Although the switch delay device can have a number of forms, one simple yet effective way to implement it is to use a diode device. The diode device prevents the rising input signal from being transmitted until it has reached the turn on voltage of the diode device and thus, it delays the switching of the device in a convenient and low power way.

In some embodiments, said switch delay device further comprises a voltage reducing device for reducing a voltage level at an output of said diode device, said voltage reducing device being responsive to said second predetermined value at said output of said output circuitry to be active and being responsive to said first predetermined value at said output of said output circuitry to switch off.

In addition to the diode device it may be advantageous to have a voltage reducing device which reduces the voltage level at the output of the diode device and in this way the rising edge input is prevented from being transmitted until it reaches the turn on voltage of the diode and after that it is reduced by the voltage reducing device and thus, it takes longer to reach the threshold value required to switch the output circuitry and the signal sent along the first input circuit has therefore reached a higher value by the time the output circuitry switches. It should be noted that the voltage reducing circuit can be tuned to control the amount that the voltage is reduced by and thereby tune the upper threshold limit at which the device switches. This device can be switched off when a rising edge is not being transmitted as then it is not needed. However, it should be noted that when the next signal to be detected is a falling edge then the first input and second input paths are connected by the connecting path and as such the input signal is sent directly via the first input path to both the first input and the second input and the devices on the second input path therefore have no effect. However, in order to save power it is convenient if this device is switched off. In this respect it should be noted that a diode is a good device for delaying the switching as it does not consume power simply blocking the signal until this has reached a turn on voltage.

In some embodiments, said voltage reducing device is configured to hold an output of said diode device at a low level of said second lower voltage domain in response to said input signal being said low level of said second lower voltage domain.

The voltage reducing device can also be useful in holding the output of the diode device at the low level of the second lower voltage domain when the input signal is low. It should be noted that by having the diode device on this input path when the input signal is low the output of the diode device is floating and thus, it is advantageous if this output can be held at the low voltage level and there is no longer this floating node in the circuit.

In some embodiments, said controllable connecting path comprises a switch, said switch receiving a control signal and being responsive to a value of said control signal to either connect said first and second inputs or to disconnect said connecting path such that said first and second inputs are not connected via said connecting path.

Although the controllable connecting path can be implemented in many ways, a simple way of implementing it is to provide a switch on the path, the switch being controlled by a control signal to either connect the first and second inputs or to disconnect them.

In some embodiments, said apparatus further comprises control signal generation circuitry for generating said control signal, said control signal generation circuitry being responsive to said signal output by said output circuitry comprising said predetermined value to generate a first control value and to said output signal not comprising said predetermined value to generate a second control value, said switch being responsive to said first control value to connect said two inputs and to said second control value to disconnect said connecting path.

The control signal is dependent on the signal output by the output circuitry so that the two inputs are connected when the falling signal is being detected such that there is no delay provided but are disconnected when the rising signal is being detected so that there is a delay to the switching meaning that the output has reached a higher voltage when the device switches. In this way hysteresis is provided.

In some embodiments, the apparatus further comprises a second controllable connecting path arranged in parallel with said controllable connecting path, said second controllable connecting path comprising a second switching device, said control signal generation circuitry generating a second control signal that is an inverted version of said control signal, said second switching device being responsive to said second control signal to switch together with said switching device switching in response to said control signal.

Although a single connecting path will perform the required function, in order to avoid risks of oscillation and provide good symmetry, it is convenient if there is circuitry for generating a control signal that produces a delay between the output signal switching and the control signal being generated. The symmetry and delay can be produced using two paths with a control signal and the inverse of this control signal being used to switch them.

It should be noted that although the plurality of devices could have a number of forms provided that they can produce the function required of the output circuitry in some embodiments they comprise switching devices. These may for example, be transistors or they may be NAND or OR gates.

Although the output circuitry can take a number of forms in some embodiments it comprises an inverter.

An inverter is a simple and well known way of switching one signal received at one voltage level into another signal at another voltage level.

The inverter may have a number of forms but it may simply comprise a PMOS transistor and an NMOS transistor arranged in series.

In other embodiments, the output circuitry comprises a cascoded inverter.

It may be desirable to use a cascoded inverter as then you have additional transistors in your output circuitry that can be used as control devices for other functions such as enabling or disabling parts of the circuit.

In some embodiments, said first set comprises a plurality of PMOS transistors arranged in series and said second set comprise a plurality of NMOS transistors arranged in series.

In some embodiments, said output circuitry further comprises an additional second set arranged in parallel with said second set between said output of said cascoded inverter and said low voltage source, at least one device in said additional second set being arranged to receive signals from said first input, said apparatus further comprising selecting circuitry for selecting either said second set or said additional second set to be operational.

When hysteresis is not mandatory, it is possible to remove it with an additional second set of devices in parallel with the second set of devices in the second input path. These devices receive signals from the first input. If this apparatus has selecting circuitry then either the second set or the additional second set can be selected to be operational. Thus, a device that operates with or without hysteresis can be selected.

In some embodiments, said selecting circuitry is configured to generate a hysteresis enable signal in response to an input requesting hysteresis, said second set comprising: at least one device configured to receive said hysteresis enable signal and being responsive to no hysteresis enable signal to switch off and provide an open circuit and being responsive to said hysteresis enable signal to switch on and provide a conducting path, and at least one further device for receiving signals from said second input; and said additional second set comprising: at least one device configured to receive said hysteresis enable signal and being responsive to no hysteresis enable signal to switch on and provide a conducting path and being responsive to said hysteresis enable signal to switch off and provide an open circuit, and at least one further device for receiving signals from said first input.

The selecting circuitry can generate a hysteresis enable signal in response to an input requesting hysteresis. This input may be provided by a user. If cascoded output circuitry is used then one of the devices can be used as an enabling device and the other as a functional device. The enabling device can then be turned on or off in response to the enable signal and thus, either the second set or the additional second set can be rendered operational and the operational set is then the one used. The input signal for the second set comes from the second input path with the delay device when the connecting path is open and the input signal for the operational device of the additional second set comes from the first input and therefore has no delay.

In some embodiments, said second set and said additional second set each comprise two NMOS transistors arranged in series between said output and said low voltage source.

A second aspect of the present invention provides a method of receiving input signals in a first higher voltage domain and generating and outputting signals in a second lower voltage domain, using an apparatus comprising: an input pad for receiving said input signals in said first higher voltage domain; output circuitry comprising a plurality of devices arranged between a high voltage source of said second lower voltage domain and a low voltage source, said plurality of devices being arranged in a first set and a second set, said first set being arranged between said high voltage source and said output and said second set being arranged between said output and said low voltage source, said output circuitry being configured to switch to output a first predetermined value in response to a rising input signal exceeding an upper threshold value and to switch to output a second predetermined value in response to a falling input signal falling below a lower threshold value; said method comprising: sending a received input signal along a first input path to a first input of said first set; and sending said received input signal along a second input path to a second input of said second set; reducing a voltage of said received input signal travelling along said second path such that on a rising input signal, said input signal has reached a higher value when said output circuitry switches in response to said input signal than had said voltage level not been reduced; and in response to detection of said output circuitry outputting said first predetermined value connecting said first input and said second input together, and in response to detecting said second predetermined value at said output not connecting said first and said second input together.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
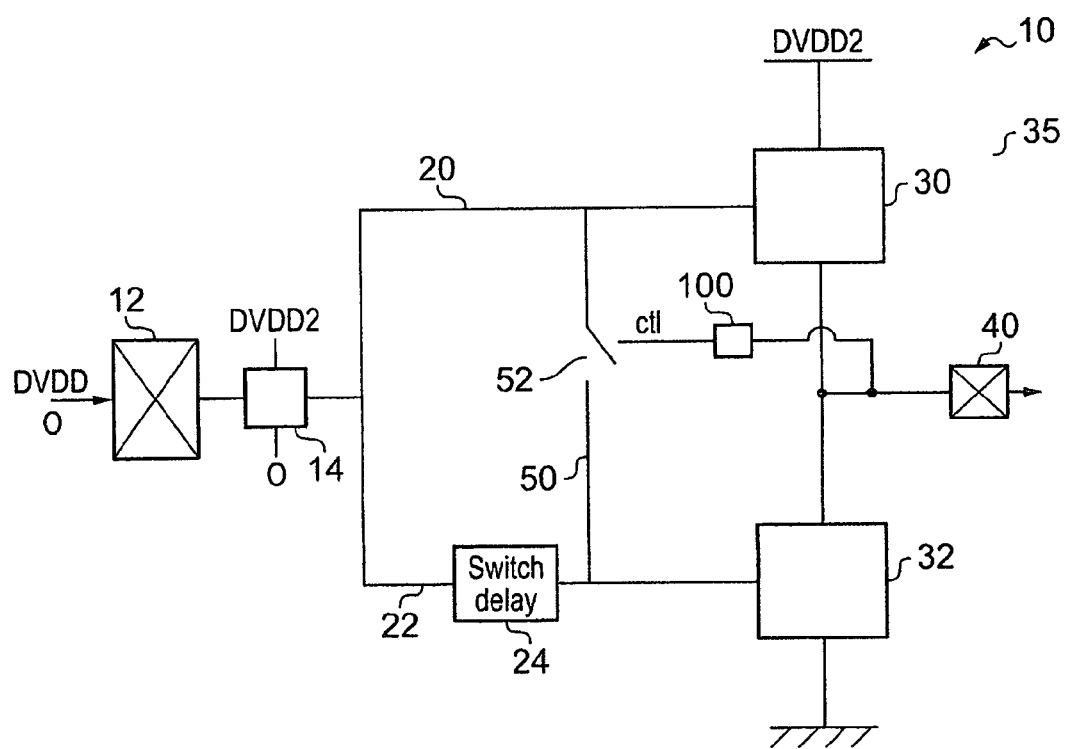
FIG. 1 shows an apparatus for receiving high voltage signals and outputting low voltage signals according to an embodiment of the present invention.

FIG. 1 shows a high voltage input-output receiver 10 for receiving signals of a high voltage domain and outputting into a lower voltage domain using devices of the lower voltage domain according to an embodiment of the present invention. This apparatus 10 has an input pad 12 for receiving an input signal in the higher voltage domain which has a high voltage level of DVDD. DVDD may typically be 3.3 Volts. There is then a voltage level controlling device 14 which acts to clamp the upper voltage to DVDD2 which is the voltage of the second lower voltage domain which the devices of apparatus 10 are designed to function within and which is the voltage domain of the circuitry to which the output signals are sent. This signal may for example have a high value of 1.8 Volts.

The apparatus 10 has two input paths for the received signal, first input path 20 and second input path 22. These signals are sent to output circuitry 35. First input path 20 goes to a first set of devices 30 that lie between the upper voltage rail of the second voltage domain DVDD2 and the output 40 of output circuitry and the second input path goes to a second set of devices 32 that lie between the output 40 and ground.

This second input path has switch delay circuitry 24. This switch delay circuitry acts to delay the switching of the output circuitry in response to the rising edge of the input signal. If a rising signal is input at input 12 it passes along both path 20 and path 22 in parallel. The signal passing along path 22 has its voltage level reduced by the switch delay circuitry 24 and in this way, the switching of the output circuitry 35 is delayed as this signal does not reach the requisite value until later. Thus, the signal passing along path 20 has reached a higher value when the signal does switch.

The apparatus also has connecting path 50 that has a switch 52 in it. This switch is controlled by control circuitry 100 that is responsive to the value at the output 40 and closes to connect path 20 and 22 together when the circuit is detecting a falling edge of a signal at the output 40 as in this case it is not desirable to delay the switching of the output circuitry. The switch is however open when the circuitry is detecting a rising edge as at this point we wish to artificially increase the threshold value at which the output circuitry 35 switches and we do this by reducing the voltage on the input signal on path 22 using the switch delay circuit 24. In this way we can increase the input threshold on the rising edge and thereby generate hysteresis while using the low power supply without unbalancing the output circuitry 35.

Figure 2:
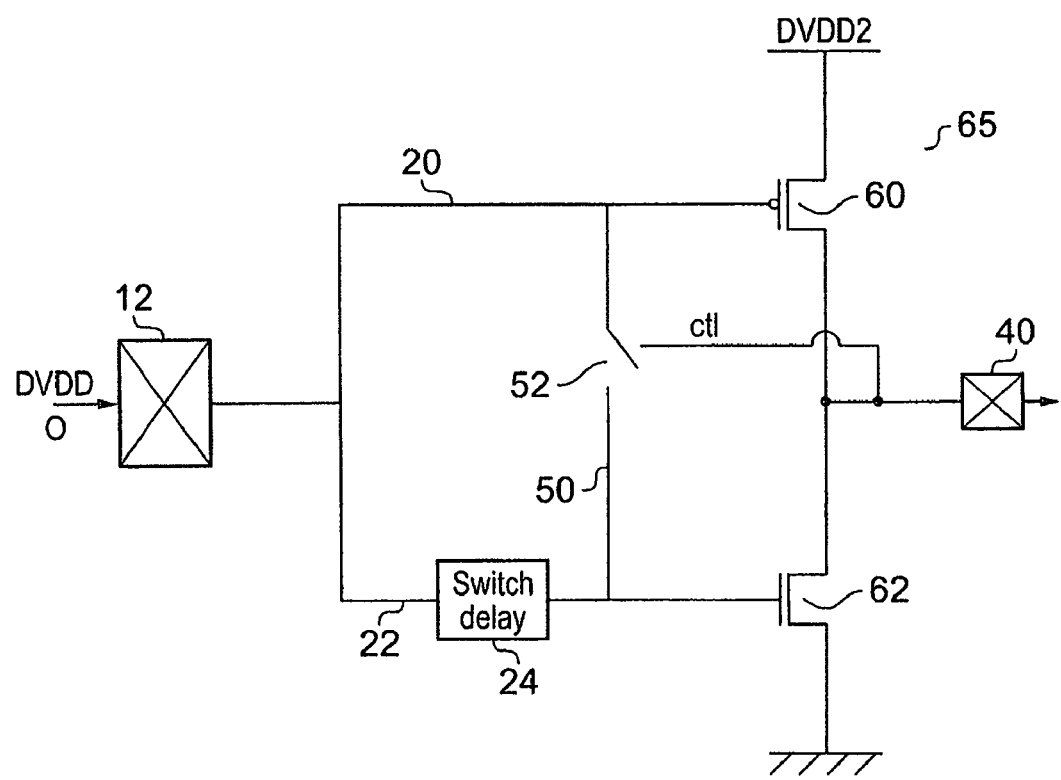
FIG. 2 shows an apparatus for receiving high voltage signals and outputting low voltage signals with output circuitry in the form of an inverter according to an embodiment of the present invention.

FIG. 2 shows an embodiment of the present invention where the output circuitry is an inverter. In this embodiment a high voltage signal is received at input 12 and it is again split into two signal paths 20 and 22 to be sent to the PMOS transistor 60 of inverter 65 and to the NMOS transistor 62 of inverter 65 respectively. There is again a connection path 50 connecting the two inputs of the two transistors in a controllable manner using switch 52.

Thus, once again on a rising edge the switching of the inverter is delayed using circuitry 24 which reduces the voltage of the input signal travelling along path 22. Thus, in this case, a rising edge is delayed and a higher threshold voltage is therefore reached before the output switches in response to the rising edge. As it is an inverter in response to a rising edge the output switches from a one to a zero. A zero at the output acts as a control signal to switch 52 to close it and therefore, when a falling edge occurs on the input signal, the input to the two transistors 60 and 62 of inverter 65 are connected together and they both see the falling edge at the same time and switching is not delayed.

Figure 3:
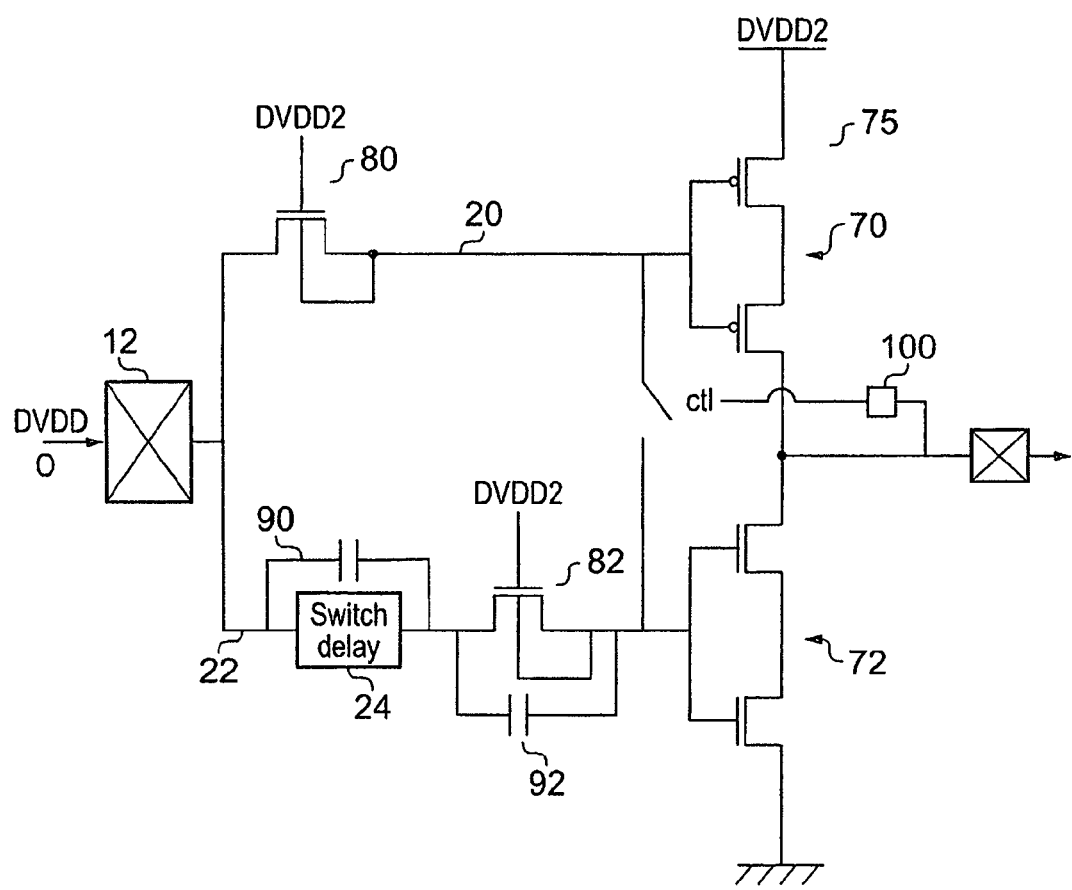
FIG. 3 shows an apparatus according to an embodiment of the present invention having a cascoded inverter as the output circuitry.

FIG. 3 shows a further embodiment of the present invention. In this embodiment the output circuitry 75 is a cascoded inverter having a set of PMOS transistors 70 and a set of NMOS transistors 72. This device has a voltage limiting device on each input path in the form of pass gates 80 and 82 and these limit the maximum level of the input signal to DVDD2.

Additionally switch delay circuitry 24 has a capacitive device which in this embodiment is a simple capacitor 90 arranged in parallel with it and similarly pass gate 82 has a capacitor 92 arranged in parallel with it. These capacitors are arranged in this way to speed up the circuit in transient mode. It will balance the negative effect on the speed of the device introduced by the switch delay circuitry 24 and pass gate 82. Thus, the capacitors are provided so that transient signals do not see pass through the delay device or the pass gate on the second input path and the speed of the device in transient mode is not affected by these devices. The capacitive devices also help to balance paths 20 and 22.

Figure 4:
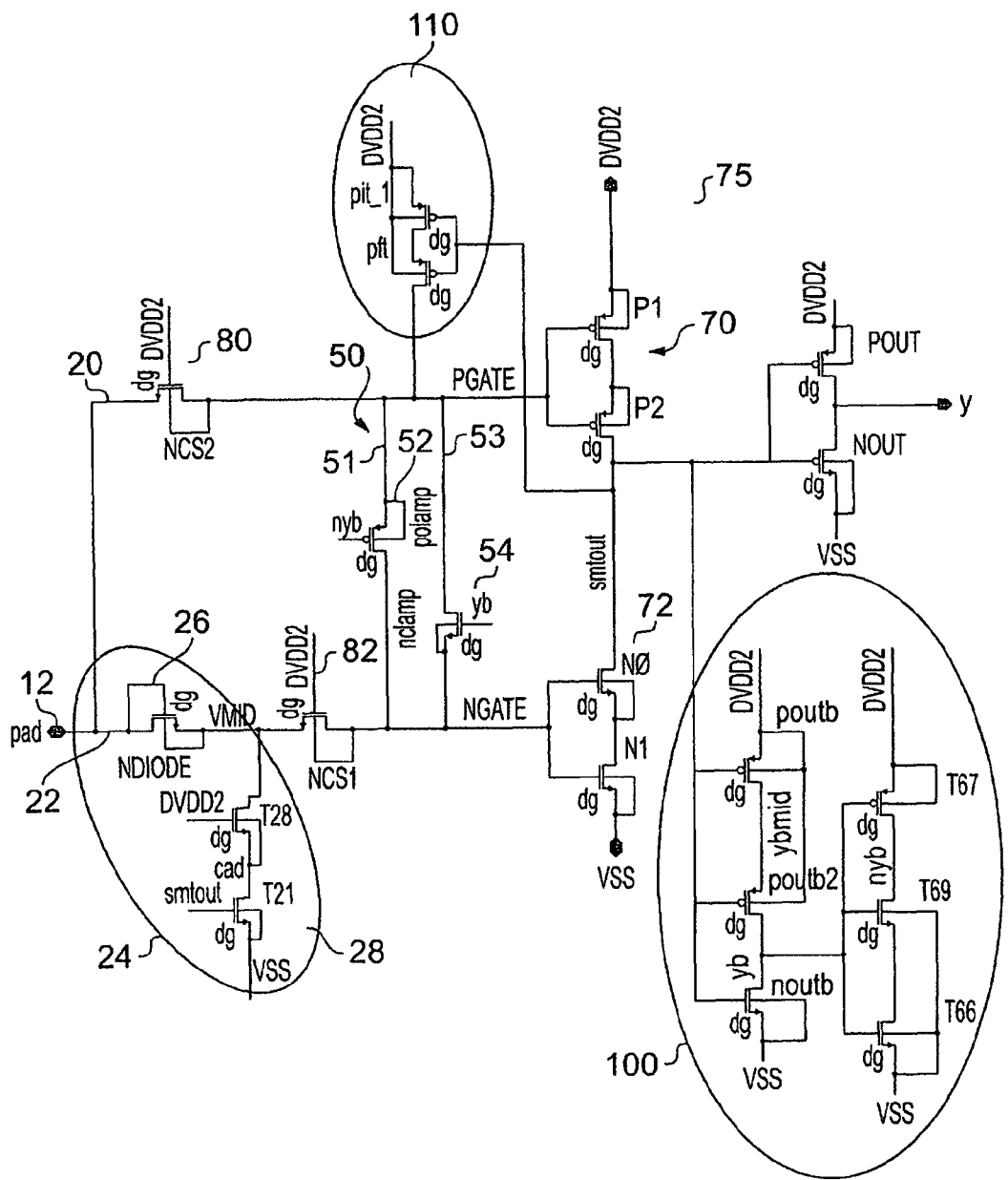
FIG. 4 shows a further apparatus according to an embodiment of the present invention with a cascoded inverter as output circuitry.

FIG. 4 shows an embodiment of the present invention in which the output device 75 is a cascoded inverter. In this device the switch delay circuitry 24 is shown in more detail and comprises a diode device 26 and a device for reducing the voltage at the point VMID 28. The diode device 26 is a diode mounted NMOS transistor and in response to a rising signal received at the input pad 12 it will impede the transmission of the signal to the node VMID until the rising voltage at pad 12 reaches a sufficient voltage to switch the diode on.

A voltage reducing device 28 which in this case is a cascoded NMOS transistor with its gate connected to the output of the cascoded inverter will reduce the voltage at the VMID when it is turned on and thereby shift the threshold voltage of inverter 75. In this way it can be used to adjust the threshold voltage VIH and thereby the amount of hysteresis. As it is connected to the output signal it is switched off once the inverter switches in response to the rising edge. Furthermore, when it is switched on when the input signal is low, it holds VMID at zero and prevents it from floating which it might otherwise do when diode 26 is switched off.

Pass gates 80 and 82 are present to limit the input signal that reaches the devices downstream of them and prevent any stress occurring to these devices due to an input signal that is received in a different voltage domain. Connecting paths 50 are in this embodiment two connecting paths 51 and 53 having switches 52 and 54 respectively. These switches are controlled by control circuitry 100. Connecting paths 50 is present to clamp the input of 70 and 72 together once the inverter has switched in response to the rising edge. This cuts out path 22 from the device when a falling edge is detected. Control circuitry 100 generates two control signals yb and nyb by the use of two di-symmetric inverters. These are designed to commute a little bit later than the output of the receiver and thus, the two inputs are clamped together slightly later than the output switches and this prevents oscillation.

In this embodiment there are two paths that are controlled by opposite outputs of the di-symmetric inverter and as these are not directly connected to the output of the receiver which also helps avoid any oscillation risk.

There is also leakage protection device 110 that is formed with two PMOS transistors in this embodiment and these are used to set the value of pgate and ngate to DVDD2 when the input signal received at pad 12 is high. This sets a strong DC level and helps reduce DC leakage by turning the PMOS transistors 70 off.

Operation of this device will now be described. On the falling edge of the input signal the inputs to the two sets of devices 70 and 72 of inverter 75 are clamped together and will follow the pad value from DVDD2 to the threshold voltage of the inverter VIL. VIL will be the intrinsic threshold of this inverter. By a proper design this threshold can be set to be above 0.8 voltages which is the required specification without unbalancing the inverter. In effect, the structure used to shift the VGS of the PMOS and NMOS of the inverter can be shifted to allow for the required VIH and VIL. Furthermore, by a proper design of the switch delay devices 24 sufficient hysteresis can be generated as required. In effect this device leaves VIL unaffected while VIH is increased. In this way a fully functional receiver operating within the second domain power supply can be built and yet fulfil all the standard specifications.

Figure 5:
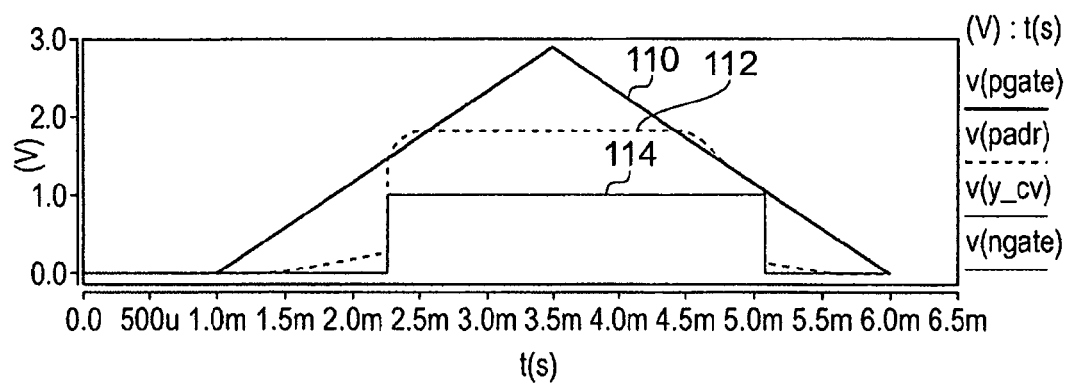
FIG. 5 shows timing diagram for operation of the circuitry of FIG. 4 in DC operation.

FIG. 5 shows the DC behaviour of the circuit. A very slow transition is shown by line 110. As it rises the voltage level at NGATE is shown by line 112. Initially this does not increase owing to the diode device 26. Once the threshold is reached it starts to increase however it is pulled down by device 28 until it reaches the threshold voltage VIH at which point the inverter switches and the output signal 114 rises. At this point the voltage level reduction device 28 is turned off and the connecting paths 50 connect such that the two input paths are connected together. At this point, the input signal at NGATE and PGATE are the same and they are the value of DVDD2 which is set by pass gate 80.

When signal 110 drops below DVDD2 the signal at NGATE and PGATE follow this value until they reach the threshold value VIL at which point the inverter switches and the output signal 114 drops.

Figure 6:
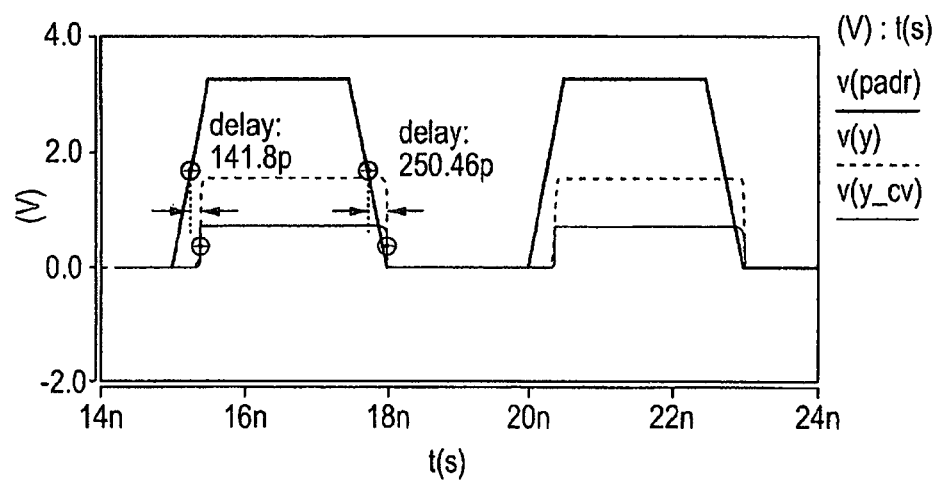
FIG. 6 shows timing diagram giving operation of the circuit in transient or AC operation.

FIG. 6 shows the AC behaviour of this circuit. In this embodiment the NGATE transitions at high frequencies have been speeded up by using capacitors between the input pad and VMID in parallel with device 24 and between VMID and NGATE in parallel with device 82. As can be seen the output signal follows the input signal fairly closely but at a reduced level as would be expected.

Figure 7:
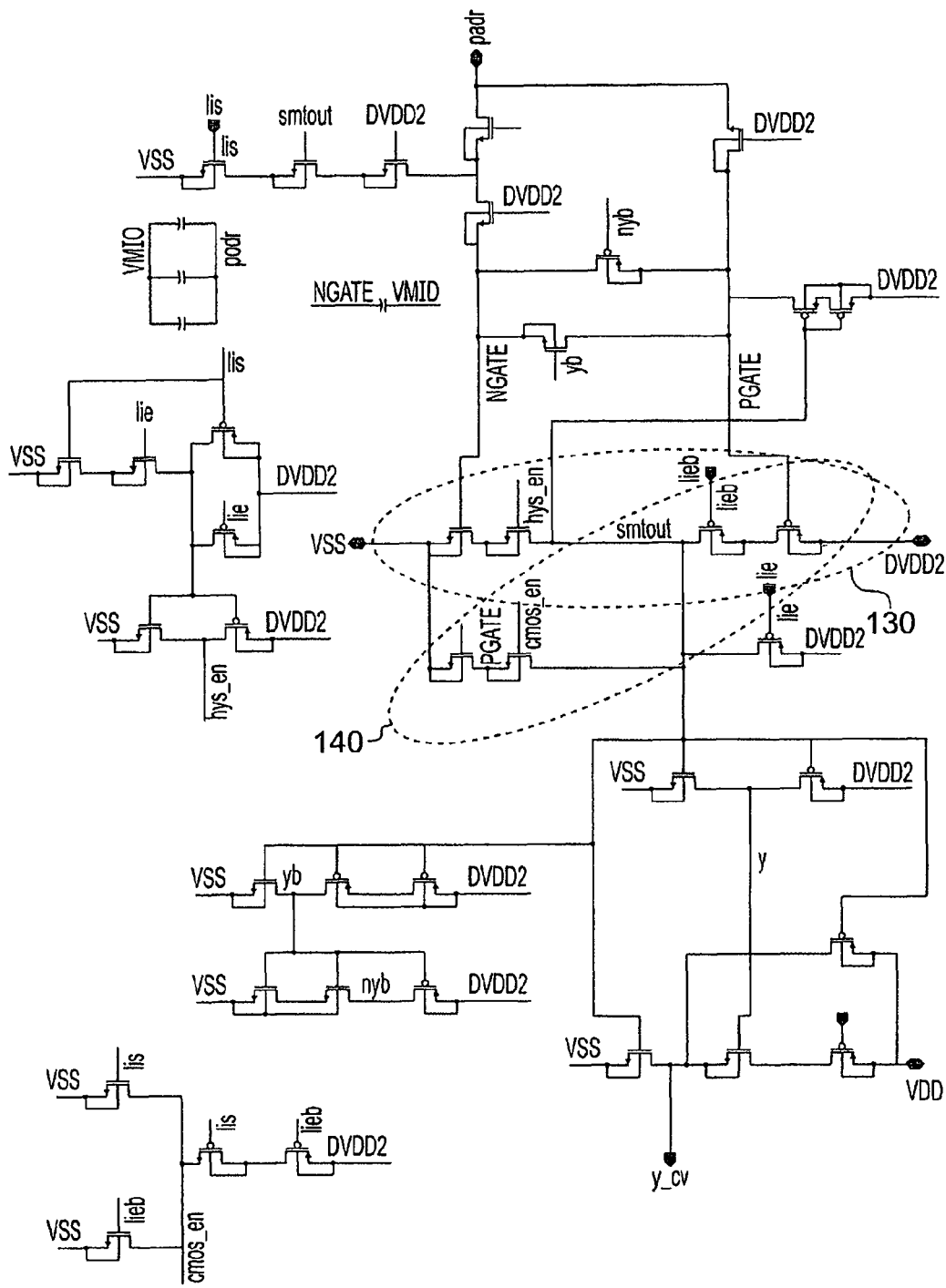
FIG. 7 shows an apparatus for receiving a high voltage signal and outputting a low voltage signal with hysteresis enabled and no-hysteresis enabled states.

FIG. 7 shows an apparatus with a fully programmable input with both hysteresis and CMOS methods of operation. In this device circuit 130 shows the output circuitry which in this case is a cascoded inverter that is hysteresis enabled while circuit 140 shows the output circuitry which is not hysteresis enabled but in this case is CMOS enabled. This latter is a standard cascoded output inverter and thus, provides the inverting and level shifting function but no hysteresis as the switch delay path is removed. There are enable switches on the NMOS transistors in the lower half of the cascoded inverters and these are used to turn either one of these on or off.

Thus, when CMOS mode is enabled the PMOS branch is used as it is and the NMOS branch is replaced by a standard cascoded NMOS with its gate connected to PGATE, the input of the PMOS transistors. In a hysteresis enabled form the device is very similar to the device of FIG. 4 with the addition of the enable signal. This enable signal turns an NMOS transistor in circuit 140 off and the corresponding NMOS transistor in circuit 130 on. In this way either one of the NMOS parts of the inverter are enabled.

In this figure, there is also the possibility of enabling or disabling the whole receiver using signal lie and its opposite lieb. When the receiver is disabled, the inverter is cut off and the output y_cv is pull down to 0. Signal lis is used to select either hysteresis or non hysteresis mode. Signal lis is combined with lie and lieb to generate hys_en and cmos_en. It is done like this as input enable has a higher priority than hysteresis/no hysteresis mode (when lie=0 both 130 and 140 are cut off whatever the value of lis is).

Figure 8:
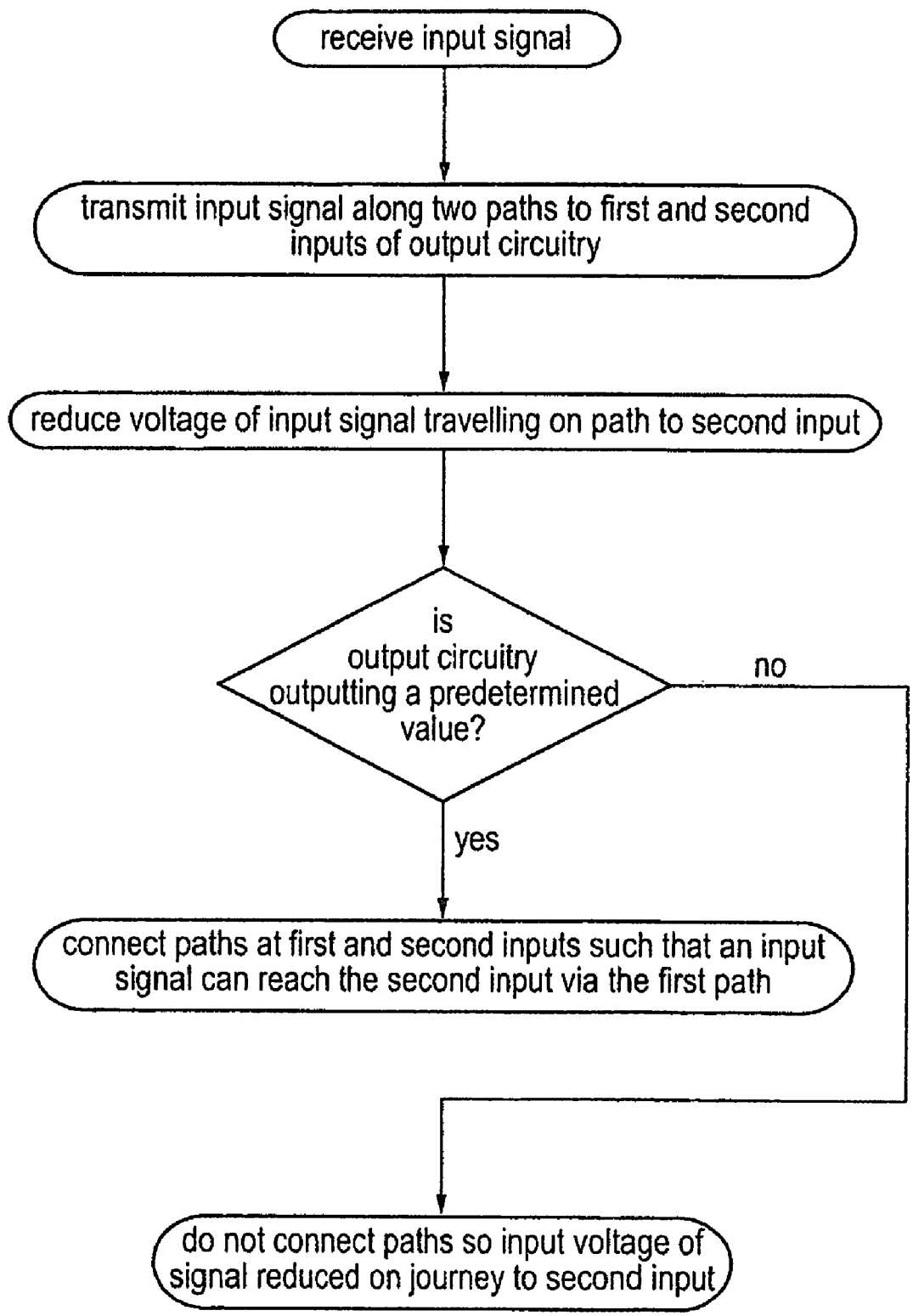
FIG. 8 shows a flow diagram showing a method according to an embodiment of the present invention.

FIG. 8 shows a flow diagram illustrating in a simple form a method according to an embodiment of the present invention. Initially an input signal is received and this is divided into two paths and transmitted along these paths to a first and second input of output circuitry. The first input goes to a first set of devices which are operating at a higher voltage than the second set of devices to which the second input goes. The voltage of the input signal along the path of the second input is reduced.

It is determined if the output circuitry is outputting a predetermined value. If it is then the paths that are present to connect the first and second inputs are connected so that the input signal reaches the second input via the first path and does not have its voltage reduced. If the output circuitry is not outputting a predetermined value then these paths are not connected so the voltage of the input signal is reduced. In this way depending upon whether or not the output circuitry is outputting a predetermined value the voltage of the signal along the second path can be reduced or not Reducing this value delays the switching of the output device and thereby increases the threshold value of the rising edge switch and introduces hysteresis to the circuit without unbalancing it.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An apparatus for receiving input signals in a first higher voltage domain and for generating and outputting signals in a second lower voltage domain, said apparatus comprising:
    an input pad for receiving said input signals in said first higher voltage domain;
    output circuitry comprising a plurality of devices arranged between a high voltage source of said second lower voltage domain and a low voltage source, said plurality of devices being arranged in a first set and a second set, said first set being arranged between said high voltage source and said output and said second set being arranged between said output and said low voltage source, said output circuitry being configured to switch to output a first predetermined value in response to a rising input signal exceeding an upper threshold value and to switch to output a second predetermined value in response to a falling input signal falling below a lower threshold value;
    a first input path for sending said received input signals to a first input of said first set;
    a second input path for sending said received input signals to a second input of said second set; wherein
    said second input path comprises a switch delay device for reducing a voltage of said received input signal such that on a rising input signal, said input signal has reached a higher value when said output circuitry switches in response to said input signal than it would have reached had said input signal voltage not been reduced; and a controllable connecting path between said first and second inputs for connecting said first and second inputs together in response to detection of said first predetermined value at said output and for not connecting said first and second inputs together in response to detection of said second predetermined value at said output.

2. An apparatus according to claim 1, further comprising a voltage control circuit for controlling a maximum voltage of an input signal such that said value does not exceed a high voltage level of said second power domain.

3. An apparatus according to claim 1, wherein said voltage control circuit comprises a first and a second pass gate powered in said second lower voltage domain on each of said first and second input paths for limiting said input signal to voltage levels in said second lower voltage domain, said pass gate in said second input path being downstream of said switch delay device.

4. An apparatus according to claim 1, said apparatus further comprising a capacitive device arranged on said second input path in parallel with said switch delay device.

5. An apparatus according to claim 4 wherein said voltage control circuit comprises a first and a second pass gate powered in said second lower voltage domain on each of said first and second input paths for limiting said input signal to voltage levels in said second lower voltage domain, said pass gate in said second input path being downstream of said switch delay device, said apparatus further comprising a second capacitive device arranged in parallel with said pass gate on said second input path.

6. An apparatus according to claim 1, wherein said switch delay device comprises a diode device for preventing a rising input signal from being transmitted until said rising input signal has reached a turn on voltage sufficient to turn said diode device on.

7. An apparatus according to claim 6, wherein said switch delay device further comprises a voltage reducing device for reducing a voltage level at an output of said diode device, said voltage reducing device being responsive to said second predetermined value at said output of said output circuitry to be active and being responsive to said first predetermined value at said output of said output circuitry to switch off.

8. An apparatus according to claim 7, wherein said voltage reducing device is configured to hold an output of said diode device at a low level of said second lower voltage domain in response to said input signal being said low level of said second lower voltage domain.

9. An apparatus according to claim 1, wherein said controllable connecting path comprises a switch, said switch receiving a control signal and being responsive to a value of said control signal to either connect said first and second inputs or to disconnect said connecting path such that said first and second inputs are not connected via said connecting path.

10. An apparatus according to claim 9, further comprising control signal generation circuitry for generating said control signal, said control signal generation circuitry being responsive to said signal output by said output circuitry comprising said predetermined value to generate a first control value and to said output signal not comprising said predetermined value to generate a second control value, said switch being responsive to said first control value to connect said two inputs and to said second control value to disconnect said connecting path.

11. An apparatus according to claim 10, further comprising a second controllable connecting path arranged in parallel with said controllable connecting path, said second controllable connecting path comprising a second switching device, said control signal generation circuitry generating a second control signal that is an inverted version of said control signal, said second switching device being responsive to said second control signal to switch together with said switching device switching in response to said control signal.

12. An apparatus according to claim 1, wherein said plurality of devices comprise switching devices.

13. An apparatus according to claim 1, wherein said output circuitry comprises an inverter.

14. An apparatus according to claim 13, wherein said first set comprises a PMOS transistor and said second set comprises an NMOS transistor.

15. An apparatus according to claim 1, wherein said output circuitry comprises a cascoded inverter.

16. An apparatus according to claim 15, wherein said first set comprises a plurality of PMOS transistors arranged in series and said second set comprise a plurality of NMOS transistors arranged in series.

17. An apparatus according to claim 15, said output circuitry further comprising an additional second set arranged in parallel with said second set between said output of said cascoded inverter and said low voltage source, at least one device in said additional second set being arranged to receive signals from said first input, said apparatus further comprising selecting circuitry for selecting either said second set or said additional second set to be operational.

18. An apparatus according to claim 17, wherein said selecting circuitry is configured to generate a hysteresis enable signal in response to an input requesting hysteresis, said second set comprising:
at least one device configured to receive said hysteresis enable signal and being responsive to no hysteresis enable signal to switch off and provide an open circuit and being responsive to said hysteresis enable signal to switch on and provide a conducting path, and
at least one further device for receiving signals from said second input; and
said additional second set comprising:
at least one device configured to receive said hysteresis enable signal and being responsive to no hysteresis enable signal to switch on and provide a conducting path and being responsive to said hysteresis enable signal to switch off and provide an open circuit, and
at least one further device for receiving signals from said first input.

19. An apparatus according to claim 17, wherein said second set and said additional second set each comprise two NMOS transistors arranged in series between said output and said low voltage source.

20. A method of receiving input signals in a first higher voltage domain and generating and outputting signals in a second lower voltage domain, using an apparatus comprising:
an input pad for receiving said input signals in said first higher voltage domain;
output circuitry comprising a plurality of devices arranged between a high voltage source of said second lower voltage domain and a low voltage source, said plurality of devices being arranged in a first set and a second set, said first set being arranged between said high voltage source and said output and said second set being arranged between said output and said low voltage source, said output circuitry being configured to switch to output a first predetermined value in response to a rising input signal exceeding an upper threshold value and to switch to output a second predetermined value in response to a falling input signal falling below a lower threshold value;

said method comprising:

sending a received input signal along a first input path to a first input of said first set; and sending said received input signal along a second input path to a second input of said second set;

reducing a voltage of said received input signal travelling along said second path such that on a rising input signal, said input signal has reached a higher value when said output circuitry switches in response to said input signal than had said voltage level not been reduced; and in response to detection of said output circuitry outputting said first predetermined value connecting said first input and said second input together, and in response to detecting said second predetermined value at said output not connecting said first and said second input together.

* * * * *